(12) United States Patent
Waldrip et al.

(10) Patent No.: US 9,344,094 B2
(45) Date of Patent: May 17, 2016

(54) TEMPERATURE COMPENSATED PLL CALIBRATION

(71) Applicant: Intel Corporation, Santa Clara, CA (US)

(72) Inventors: Jeffrey W. Waldrip, Austin, TX (US); Yongping Fan, Portland, OR (US); Jing Li, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 51 days.

(21) Appl. No.: 13/837,070

(22) Filed: Mar. 15, 2013

(65) Prior Publication Data

US 2014/0266472 A1    Sep. 18, 2014

(51) Int. Cl.
*H03L 7/087*   (2006.01)
*H03L 1/02*    (2006.01)
*H03B 5/04*    (2006.01)
*H03B 5/08*    (2006.01)
*H03L 7/10*    (2006.01)

(52) U.S. Cl.
CPC ........ *H03L 1/022* (2013.01); *H03B 5/04* (2013.01); *H03B 5/08* (2013.01); *H03L 7/087* (2013.01); *H03L 7/103* (2013.01); *H03L 2207/06* (2013.01)

(58) Field of Classification Search
CPC .............. H03B 5/00; H03B 5/04; H03B 5/08; H03B 5/12; H03B 5/1237; H03B 5/124; H03B 5/1265; H03L 1/00; H03L 1/02; H03L 1/022; H03L 1/023; H03L 1/025; H03L 1/026; H03L 7/08; H03L 7/085; H03L 7/087; H03L 7/093; H03L 7/10; H03L 7/101–7/105; H03L 7/14; H03L 7/146; H03L 2207/06; H04L 7/033

USPC .......... 331/10, 14, 16, 17, 44, 117 FE, 117 R, 331/167, 176; 327/147, 156; 375/373–376

See application file for complete search history.

(56) References Cited

U.S. PATENT DOCUMENTS

| | | | | |
|---|---|---|---|---|
| 7,323,944 | B2 * | 1/2008 | Florescu et al. | 331/14 |
| 7,429,895 | B2 * | 9/2008 | Easwaran et al. | 331/16 |
| 7,463,097 | B2 * | 12/2008 | Costa et al. | 331/14 |
| 7,982,551 | B2 * | 7/2011 | Iwaida | H03L 1/023 331/117 FE |
| 8,022,780 | B2 * | 9/2011 | Taghivand et al. | 331/176 |
| 8,217,690 | B2 * | 7/2012 | Hu et al. | 327/156 |
| 8,253,506 | B2 * | 8/2012 | Liu et al. | 331/177 V |
| 8,274,339 | B2 * | 9/2012 | Fan et al. | 331/176 |
| 8,466,750 | B2 * | 6/2013 | Chiu et al. | 331/36 C |
| 8,497,741 | B2 * | 7/2013 | Pedersen et al. | 331/176 |
| 8,531,245 | B2 * | 9/2013 | Joubert et al. | 331/16 |
| 2010/0225402 | A1 * | 9/2010 | Yang et al. | 331/10 |
| 2011/0260761 | A1 * | 10/2011 | Kearney | H03L 1/02 327/156 |
| 2012/0326795 | A1 * | 12/2012 | Chiu et al. | 331/17 |

\* cited by examiner

*Primary Examiner* — Levi Gannon

(74) *Attorney, Agent, or Firm* — Green, Howard & Mughal LLP

(57) ABSTRACT

In some embodiments, provided are AFC circuits and methods for calibrating a second setting of an oscillator while a first setting is controlled by a temperature compensated control.

23 Claims, 3 Drawing Sheets

TEMPERATURE COMPENSATED PLL CALIBRATION

BACKGROUND

The present invention relates generally to phase locked loop circuits, and in particular, to a circuit for calibrating an LCPLL.

On-chip transmitters and receivers typically use PLLs (phase locked loops) to generate accurate clocks for transmitting and receiving data. With ever increasing data transfer rates, PLLs capable of generating accurate, high frequency clocks, e.g., in the ones or even tens of Giga Hertz magnitudes may be needed. LCPLLs (inductor capacitor PLLs), which may use inductor capacitor voltage controlled oscillators (LCVCOs), capacitive controlled tank oscillators, or other oscillators, may be used to deliver such high frequency clocks. Unfortunately, an oscillator (e.g., VCO) in an LCPLL typically has a limited tuning range. To address this, LCPLLs have used automatic frequency control (AFC) techniques to calibrate oscillator settings to conform about an operable control voltage range.

FIG. 1 shows a portion of an LCPLL with a conventional AFC implementation. The PLL loop portion includes a phase frequency detector (PFD), a charge pump (CP), and a low-pass filter (LPF), represented in block 106, and an LCVCO 108 (feedback path not shown for brevity). The PLL operates to generate an output clock (VCO Clk) that accurately tracks an input reference clock (Ref_Clk) using negative feedback to adjust the LCVCO based on a measured difference (or error) between the Ref_Clk and Fb_Clk, a signal fed back from the VCO Clk output. (For convenience, the path from VCO Clk to Fb_Clk is not shown, but VCO Clk is coupled back to Fb_Clk, either directly or indirectly via one or more other circuit blocks.)

The AFC portion includes frequency detector 102, calibration logic 104, and calibration voltage (Vmid) 110, coupled as shown. It typically runs once at power-up to calibrate the VCO frequency to be close to the target reference clock frequency. Initially, in the calibration mode, the "Cal" pathway switch is closed to apply a fixed voltage (Vmid) as the control voltage (Vctl) to the LCVCO. The LCVCO 108 includes a bank of capacitors that may be engaged or disengaged in different combinations, as set by the digital CapSel [N:0]input. This provides a range of adjustable capacitance values that correspond to an output frequency range. During calibration, the calibration logic 104 functions, based on the fixed Vmid control voltage, to adjust the capacitor value, as set by CapSel[N:0], so that the VCO Clk center frequency is sufficiently close to a target operating frequency (as set by $Ref_{13}Clk$). Vmid, as implied by its name, is typically set to be in the middle of the operating control voltage (Vctl) range so that a sufficient degree of adjustability is available during PLL operation.

After AFC completes, the PLL is allowed to lock normally. Unfortunately, the VCO may have an undesirable temperature coefficient, which causes the VCO frequency to change with temperature for a fixed control voltage value. Due to this, the PLL control voltage (Vctl) during lock will change as temperature changes. For a large enough temperature change, if the VCO temperature coefficient is large, the control voltage can become too low or too high for the PLL to stay locked. Even if the change isn't large enough to cause the PLL to lose lock, the control voltage change may still cause the PLL bandwidth or jitter to fall out of spec as the temperature changes.

Accordingly, new solutions may be desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
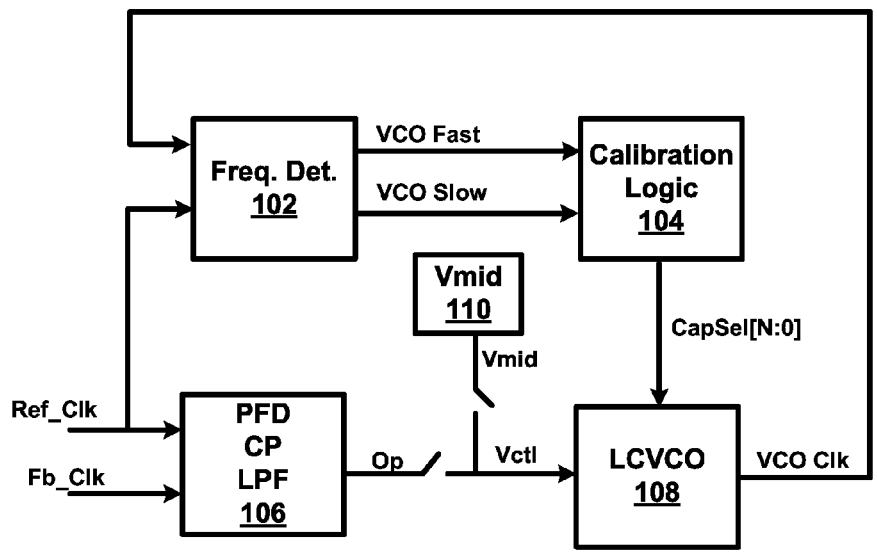
FIG. 1 is a diagram of a portion of an LCPLL with a conventional AFC.
Figure 2:
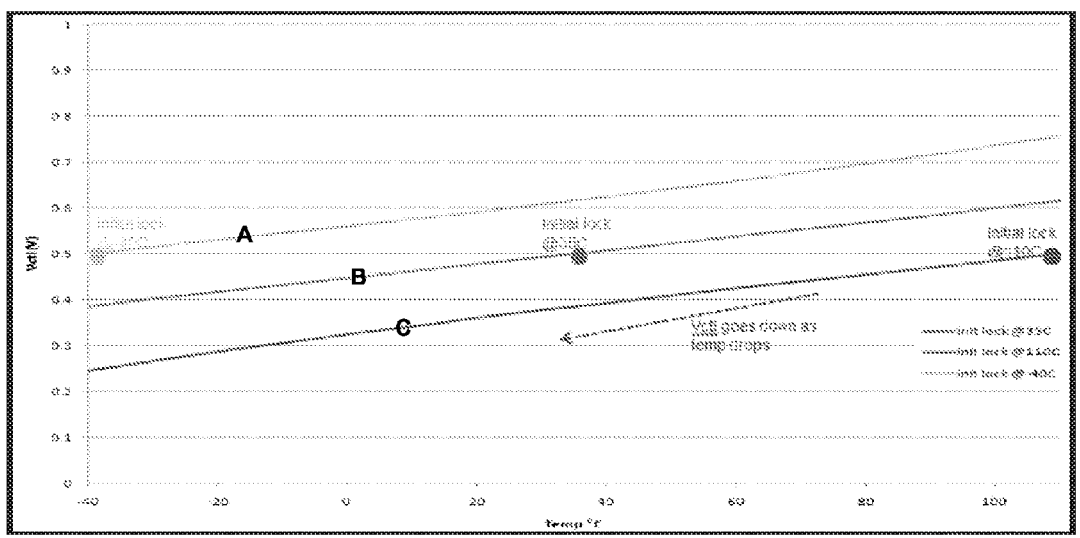
FIG. 2 shows graphs illustrating control voltage ranges over a temperature range for the LCPLL and AFC of FIG. 1.

As shown in FIG. 2, it has been appreciated that the problems associated with the AFC solution of FIG. 1 can occur if the LCVCO is calibrated at an extreme, high or low, temperature when the control voltage (Vmid) stays reasonably constant (or at least is not temperature compensated) regardless of the temperature. FIG. 2 shows the PLL's Vctl value during lock, as a function of temperature. The three lines are for the PLL initially locking at one of three different temperatures. As shown, for each lock condition, the calibration control voltage (Vmid), which is not compensated for temperature, is essentially the same (Vmid=Vcc/2=0.5V). At the different temperatures for the same target frequency, the AFC calibration logic locks at different clock frequency bands (CapSel [N:0] values). With this example, when the PLL is locked at −40 C for AFC calibration (curve A), during normal operation mode, the Vctl must go all the way up to 0.75V to maintain lock for a temperature range of up to 110 C. In some implementations, this may be an excessive Vctl range for desired operation. For example, Kvco (the VCO frequency response as a function of Vctl) at this high control voltage may be significantly lower than at Vmid (0.5 V), and thus, the PLL loop bandwidth would go lower and jitter peaking would become more problematic. The same problem may occur when the AFC calibration takes place at the high end of 110 C. For this case (curve C), the selected capacitance value (CapSel[N:0]) results in an operational Vctl range of from between 0.25 V to 0.5 V, which may be problematic in the lower Vctl operating region.

In order to address this problem, some embodiments disclosed herein use a temperature compensated oscillator control parameter for calibrating the PLL. For example, with a VCO, a temperature compensated control voltage (e.g., temperature compensated Vmid) may be used to account for temperature drift.

Figure 3:
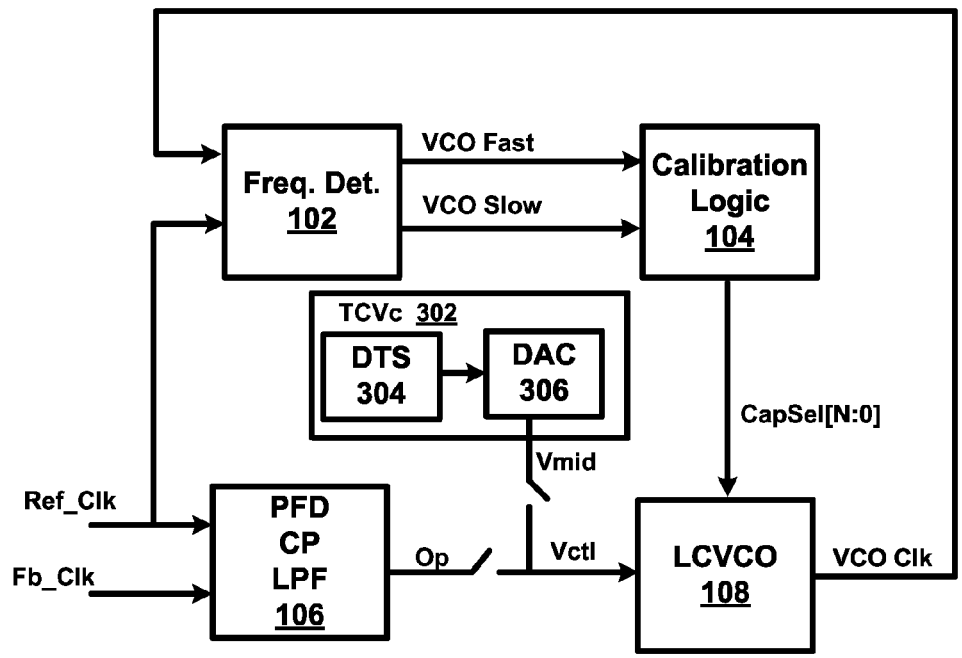
FIG. 3 shows a diagram of a temperature compensated AFC in accordance with some embodiments.

FIG. 3 shows the PLL and AFC circuits of FIG. 1 but with a temperature compensated calibration voltage source 302 instead of the fixed Vmid source. With this approach, the VCO control voltage driven during AFC (calibration mode) is a function of the temperature. Typically, the control voltage range will be centered about the LCVCO's maximum Kvco. Since Kvco usually decreases away from this point, this results in a tighter control voltage (Vctl) range, with Kvco variation, and thus jitter, being reduced.

The temperature compensated calibrated voltage source (TCVc) 302 includes an on die temperature sensor 304 coupled to a DAC (digital to analog converter) 304 to generate a temperature compensated calibration control voltage. The TCVc is designed to cause the VCO to generate the target frequency at a capacitor setting so that the control voltage stays within a desired range over the expected operating temperature window during operational modes. For example, the TCVc might be designed to cause AFC to set the LCVCO capacitance so that the middle curve (B) of FIG. 2 is attained, regardless of the temperature at which the PLL is calibrated.

Figure 4:
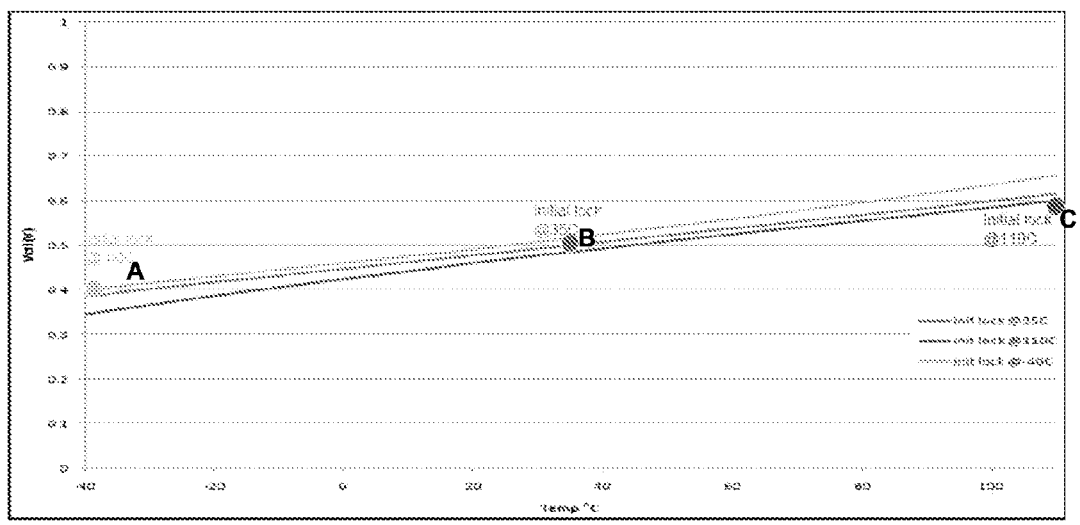
FIG. 4 shows graphs illustrating control voltage ranges over a temperature range for the LCPLL and temperature compensated AFC of FIG. 3.

FIG. 4 shows the curves of FIG. 2 but with the use of the temperature compensated calibrated control voltage of FIG. 3. With this example, the control voltage for operational modes would now range from only as low as 0.35 V and only as high as 0.65 V, regardless of the temperature at calibration lock. With this example, at −40 C, Vctl is driven to 0.4 V, at 35 C to 0.5V, and at 110 C to 0.6V. The operational Vctl voltage range is reduced since the calibration logic 104 picks almost the same CapSel[N:0] code for each temperature. So, for example, when the calibration occurs at −40 C (Vmid is at 0.4V), when the temperature goes to 110 C, the control voltage reaches ~0.65V. Compared with ~0.75V in the prior art solution of FIG. 1, Vctl is much better centered around the Kvco max. of 0.5, and therefore loop bandwidth and jitter peaking variation are reduced.

It should be appreciated that the TCVc may be implemented in any suitable manner. For example, while in the depicted figure, it uses a digital temperature sensor and a DAC, calibrated to achieve a desired Vctl operating window, alternative circuits could be employed. For example, an analog temperature sensor with suitable signal conditioning could be used. Moreover, while the circuit elements appear to be part of a dedicated circuit unit, they could be located apart from each other and function in other circuits in addition to the AFC circuit. For example, any suitable temperature sensor on the chip, dedicated or not to the TCVc, could be used.

Figure 5:
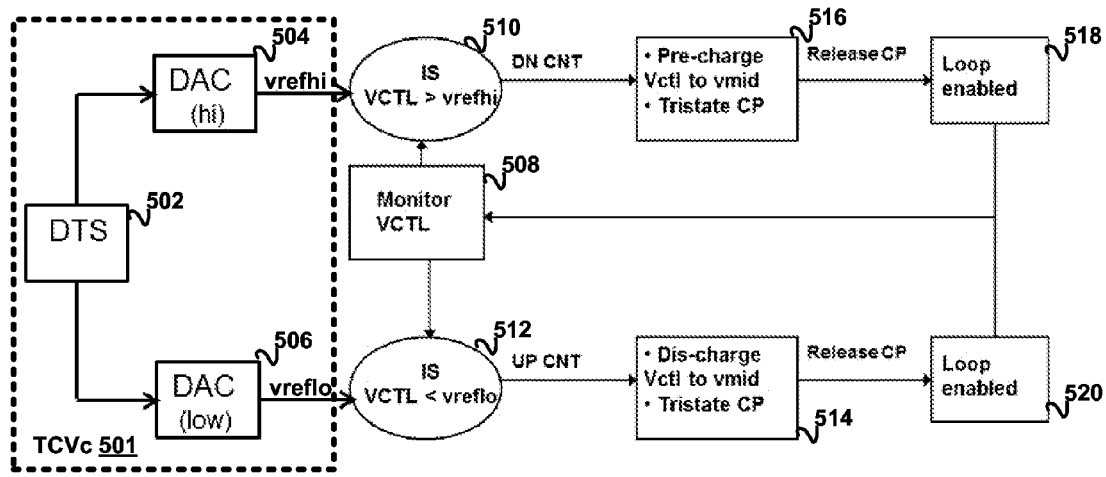
FIG. 5 is a diagram showing a temperature compensated analog AFC solution for an LCPLL in accordance with some embodiments.

FIG. 5 is a hybrid flow/block diagram showing how a temperature compensated AFC could be used for an analog PLL implementation. The analog AFC implementation functions to adjust the VCO calibration code until the PLL locks with a Vctl voltage that is within an acceptable temperature compensated range. The AFC includes a TCVc 501 formed from DTS 502 and DACs 504, 506. The TCVc is used to control the allowed Vctl range as a function of temperature. They provide temperature compensated vrefhi and vreflo voltage levels, which define high and low Vctl limits through comparators 510, 512, respectively, to set the LCVCO capacitor value so that the resulting control voltage at calibration is at an acceptable value based on the circuit temperature at calibration.

When the PLL is to be calibrated (LCVCO capacitor value set), the PLL is powered on and locked. The control voltage (Vctl) is then monitored at 508. If it is too high (higher than vrefhi), then at 510, the capacitance is reduced (e.g., CapSel[N:0] count decremented), and the routine flow proceeds to 516. Here, a charge pump may be tri-stated, and the control voltage (Vctl) is precharged to a suitable Vmid value. The charge pump is released, and the loop is enabled at 518 for the PLL to once again lock to the target frequency, and it is monitored again at 508. On the other hand, if the monitored Vctl is too low, then at 512, the capacitance value is increased (e.g., CapSel[N:0] count incremented). From here, the charge pump is tri-stated, and Vctl is discharged to Vmid. The charge pump is then released and the loop is enabled at 520, for the PLL to again lock at the target frequency. This monitoring and count adjustment (through paths UP CNT or DN CNT) continues until an LCVCO capacitor value is set that results with the Vctl being within the vrefhi and vreflo window. (Note that the vrefhi and vreflo values will typically be fairly close to each other. They correspond to the single temperature compensated Vmid level of FIG. 3 but have enough separation for a suitable operating tolerance and stable closed loop operation over encountered operational conditions. As an example, vrefhi could be made to track the uppermost curve (A) of FIG. 4, while vreflo could be made to track the lowermost curve (C) of FIG. 4.

Figure 6:
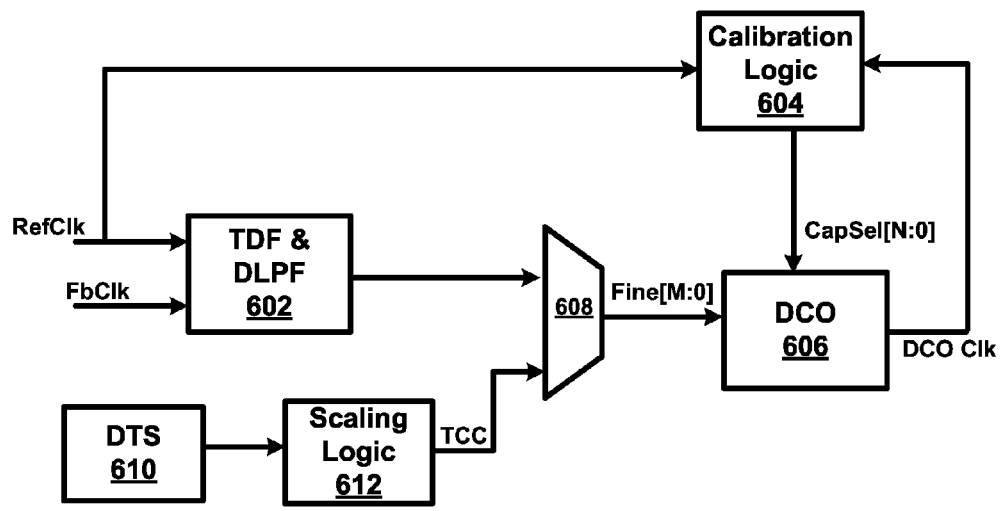
FIG. 6 is a diagram showing a temperature compensated AFC solution for a digitally controlled capacitive adjustment PLL implementation in accordance with some embodiments.

FIG. 6 shows temperature compensated AFC applied to an LCPLL design using a digitally controlled oscillator (DCO). With this PLL, the DCO (606), the output frequency is controlled by course and fine capacitor settings rather than by capacitor and control voltage settings. The CapSel[N:0] signal controls the DCO's course capacitor value setting, while a Fine[M:0] signal controls its fine capacitance value setting.

The AFC comprises calibration logic 604, DTS 610, and scaling logic 612. Calibration logic 604 functions to control CapSel[N:0] to lock the PLL with DCO Clk at the target frequency (RefClk). The DTS and scaling logic generate a temperature compensated code (TCC) to be provided as the Fine[M:0] input through mux 608 during a calibration mode. This fine tune adjustment is akin to the temperature compensated voltage of FIG. 3 in that it should cause the course adjustment (CapSel[N:0]) to set at a capacitance that results in the Fine[M:0] code being near its mid level when the temperature is at a mid range value. Of course, the scaling logic 612 could be made to follow any desired Fine[M:0]/temperature curve for desired operation.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors (including processors for mobile and server platforms), controllers, chip set components, programmable logic arrays (PLA), memory chips, network chips, and the like. In particular, the disclosed LCPLL calibration methods and circuits could be used for any LCPLL applications, including but not limited to on-chip clock generation and RF applications. For example, it could be used in transceivers (transmitters and/or receivers) for platform interfaces such as PCIe, MIPI, USB, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
    an oscillator with first and second settings for controlling an output frequency;
    a temperature compensated circuit to provide the first setting based on a chip temperature during a calibration mode, wherein the temperature compensated circuit includes an on-die temperature sensor, wherein the temperature compensated circuit is to generate a control voltage that causes the second setting to be set so that the first setting is at a maximum Kvco for a temperature that is within a middle 25% portion of an operating temperature range; and
    calibration logic to adjust the second setting, in a closed loop configuration, until the output frequency is sufficiently close to a target frequency during the calibration mode such that during an operational mode the calibration logic is to set the second setting to select almost the same capacitance code for at least two temperature points,
    wherein the calibration logic is operable to reduce loop bandwidth and jitter peaking variation associated with a Phase Locked Loop (PLL); and
    wherein the PLL is locked prior to the temperature compensated circuit and calibration logic are to operate.

2. The chip of claim 1, wherein the oscillator is an Inductor Capacitor Voltage Controlled Oscillator (LCVCO) and the temperature compensated circuit is to generate a temperature compensated control voltage for the first setting.

3. The chip of claim 2, wherein the calibration logic is part of a digital Automatic Frequency Circuit (AFC).

4. The chip of claim 2, wherein the temperature compensated circuit is part of an analog Automatic Frequency Circuit (AFC).

5. The chip of claim 2, wherein the calibration logic is operable to reduce an operational range of the temperature compensated control voltage for the first setting.

6. The chip of claim 1, wherein the temperature compensated circuit includes a digital to analog converter coupled to the on-die temperature sensor to generate the temperature compensated control voltage.

7. The chip of claim 6, wherein the digital to analog converter generates signals indicating a high limit and a low limit for the temperature compensated control voltage.

8. The chip of claim 7 comprises:
    a first comparator to compare an operational control voltage with the high limit; and
    a second comparator to compare the operational control voltage with the low limit.

9. The chip of claim 8, wherein a number of enabled capacitors in the oscillator are reduced if an output of the first comparator indicates that the operational control voltage is higher than the high limit.

10. The chip of claim 8, wherein a number of enabled capacitors in the oscillator are increased if an output of the second comparator indicates that the operational control voltage is lower than the low limit.

11. The chip of claim 1, wherein the oscillator is part of an on-chip transmitter clock generator.

12. The chip of claim 1, wherein the oscillator is a Digitally Controlled Oscillator (DCO), and wherein the second setting is to adjust a coarse capacitance value, and wherein the first setting is to adjust a fine capacitance value.

13. A computer platform, comprising:
    a chip having a transmitter to communicate with an off-chip receiver, the transmitter to apply a clock generated from a Phase Locked Loop (PLL) having an Automatic Frequency Circuit (AFC) with temperature compensated calibration, wherein the AFC is operable to calibrate a control signal for the PLL during a calibration mode,
    wherein the PLL comprises an oscillator whose frequency is controlled by first and second controls, wherein the AFC is to provide a temperature compensated output for the first control during the calibration mode, and wherein the AFC is to adjust the second control in a closed loop configuration of the PLL during the calibration mode such that during an operational mode the AFC is to set the second control to select almost the same capacitance code for each temperature, wherein the AFC comprises:
    a temperature compensated circuit which includes an on-die temperature sensor, wherein the temperature compensated circuit is to generate a control voltage that causes the second control to be set so that the first control is at a maximum Kvco for a temperature that is within a middle 25% portion of an operating temperature range,
    wherein the calibration logic is operable to reduce loop bandwidth and jitter peaking variation associated with the PLL; and
    wherein the PLL is locked prior to the temperature compensated circuit and calibration logic are to operate.

14. The computer platform of claim 13, wherein the oscillator is an Inductor Capacitor Voltage Controlled Oscillator (LCVCO), and wherein the first setting is a control voltage.

15. The computer platform of claim 13, wherein the temperature compensated output is a temperature dependent voltage that is to track a desired control voltage versus temperature relationship.

16. The computer platform of claim 13, wherein the oscillator is a Digitally Controlled Oscillator (DCO), wherein the first setting is a fine-tune capacitance adjustment, and wherein the second setting is a coarse-tune capacitance adjustment.

17. The computer platform of claim 13, wherein the transmitter is part of a serial IO port.

18. The computer platform of claim 17, wherein the serial IO port is a PCIe port.

19. A Phase Locked Loop (PLL) circuit, comprising:
an oscillator having a first setting and a capacitance setting to generate a clock whose frequency is controlled by the first setting and the capacitance setting; and
an Automatic Frequency Circuit (AFC) to calibrate, during a calibration mode, the capacitance setting and the first setting in a closed loop configuration, wherein the first setting is controlled by a temperature compensated circuit such that during an operational mode the AFC is to set the capacitance setting to select almost the same capacitance code for each temperature, wherein the temperature compensated circuit includes an on-die temperature sensor, wherein the temperature compensated circuit is to generate a control voltage that causes the second setting to be set so that the first setting is at a maximum Kvco for a temperature that is within a middle 25% portion of an operating temperature range,
wherein the AFC is operable to reduce loop bandwidth and jitter peaking variation associated with the PLL; and
wherein the PLL is locked prior to the temperature compensated circuit and AFC are to operate.

20. The PLL circuit of claim 19, wherein the temperature compensated circuit is to generate a value for the first setting that tracks a desired first setting versus temperature relationship.

21. The PLL circuit of claim 19, wherein the first setting is a control voltage.

22. The PLL circuit of claim 19, wherein the first setting is a fine-tune capacitance adjustment.

23. The PLL of claim 19, wherein the AFC comprises calibration logic and scaling logic, wherein the calibration logic is to adjust the capacitance setting, and wherein the scaling logic is to adjust the first setting.

\* \* \* \* \*